May 30, 1961 R. A. GUDMUNDSEN 2,986,481

METHOD OF MAKING SEMICONDUCTOR DEVICES

Filed Aug. 4, 1958

Richard A. Gudmundsen,
*INVENTOR.*
BY.

*ATTORNEY.*

United States Patent Office 2,986,481
Patented May 30, 1961

2,986,481

METHOD OF MAKING SEMICONDUCTOR DEVICES

Richard A. Gudmundsen, Rolling Hills, Calif., assignor to Hughes Aircraft Company, Culver City, Calif., a corporation of Delaware Filed Aug. 4, 1958, Ser. No. 752,977

8 Claims. (Cl. 148—1.5)

Figure 1:
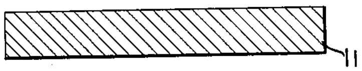

This invention relates to junction semiconductor devices and more particularly to a method of forming low resistivity regrown regions within a semiconductor crystal. The definitions of the terms active impurity, solvent metal, P-type and N-type regions and P–N junction may be found by reference to Patent No. 2,789,068, issued April 16, 1957, to J. Maserjian.

In the semiconductor art it often becomes desirable to have a low resistivity region within a semiconductor body and separated therefrom by a P–N junction. One application for such a device would be in a fused junction power diode, that is a diode capable of handling current in the order of 1 to 10 amperes. Such a low resistivity region would allow high forward conduction and at the same time low reverse current in the diode. Another example of devices in which low resistivity regions would be desirable is in junction transistors requiring a high injection efficiency emitter.

Various methods have been utilized in the prior art for producing such low resistivity regions within semiconductor bodies. One way of accomplishing this is to fuse or alloy a material with the semiconductor body which acts as an active impurity and which has a high numerical segregation coefficient. Boron is an active impurity of this type since it has a segregation coefficient of approximately one with silicon semiconductor material. However, since boron melts at a relatively high temperature, approximately 2300° C., it would be impossible to alloy boron directly with silicon which melts at a temperature of 1420° C. without destroying the silicon semiconductor body. One method, therefore, for doping a silicon semiconductor crystal with boron which has been disclosed in the prior art, is to substantially saturate an aluminum pellet with boron and then alloy the pellet with at least a portion of the semiconductor body. While this method works exceedingly well and does succeed in producing boron-doped regions within a semiconductor crystal, the percentage of boron which will go into the solution with aluminum is relatively low, on the order of about 2%. Therefore, where exceedingly low resistivity regions are desirable, this method has proven somewhat unsuccessful.

Another method which has been utilized is to evaporate aluminum-boron from a filament upon the surface of a semiconductor specimen. Most filaments which are used for carrying out this process, and especially tungsten, have an affinity for boron. The amount of boron, therefore, which reaches semiconductor body is limited not only by that amount of boron which will go into solution with aluminum but also by that amount of boron which the filament absorbs during the evaporation step.

Accordingly, it is an object of the present invention to provide a method for producing low resistivity regions within a semiconductor crystal having a greater boron content than heretofore possible in the prior art.

Another object of the present invention is to provide a method for producing fused junction semiconductor devices having exceedingly low resistivity regions therein.

A further object of the present invention is to provide a method for producing fused junction semiconductor diodes capable of carrying large amounts of current.

Still another object of the present invention is to provide a method for producing fused junction semiconductor transistors having emitter P–N junction regions therein which exhibit greater injection efficiency than heretofore possible in the prior art.

It is still another object of the present invention to provide semiconductor diodes and transistors having exceedingly low resistivity regions therein.

The method of the present invention comprises preparing an alloy of boron and at least one metal having a relatively high numerical segregation coefficient with boron, forming at least a portion of the alloy into a wafer defining an opening therethrough, placing the wafer upon a surface of a semiconductor body, heating the body and the wafer to a predetermined temperature, evaporating a layer of solvent metal upon said wafer and cooling the combination.

Figure 6:
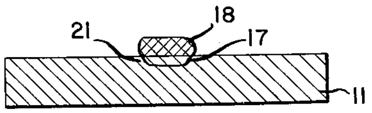
Figure 7:
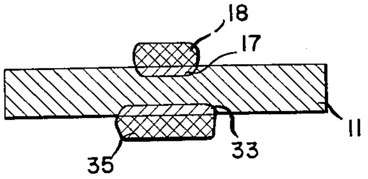

Other and more specific objects of this invention will become apparent by reference to the following description taken in conjunction with the accompanying drawing, which is presented by way of example only, in which:

Figs. 1–6 illustrate a semiconductor body taken in cross section during various stages of the method of the present invention, and Fig. 7 is a schematic representation taken in cross section of a fused junction transistor manufactured in accordance with the preferred embodiment of the method of the present invention.

Referring now to the drawing and more particularly to Figs. 1–6 thereof there is shown a semiconductor body 11. While the present invention is considered generic to all types of semiconductor material presently known to the art, the following description of the preferred embodiment of the present invention will be made with reference to silicon. Semiconductor body 11 may be prepared in any of the manners presently well known to the art such as, for example, by zone melting or by drawing a crystal from a melt as in the Czochralski method of crystal production. While it is not always considered necessary, it is often times desirable that semiconductor crystal body 11 be single crystalline in nature. The semiconductor body 11 may be a portion of an ingot produced in accordance with the above methods and which is sliced therefrom. If a transistor is to be produced from the wafer 11, it is deemed desirable to orient the crystal so that the major surfaces thereof are aligned in the crystallographic 1-1-1 plane. Although such is deemed desirable, it is to be expressly understood that other crystallographic planes may also be utilized, such as the 1-1-0 and 1-0-0 planes. A boron alloy is next prepared by alloying boron with at least one metal in which boron is readily soluble, that is a metal having a high numerical segregation coefficient with boron. Examples of metals having a high segregation coefficient with boron are silicon, germanium and silicon-germanium alloy. The material which may be used in any given case is generally controlled by the material from which the semiconductor body is constructed and may include intermetallic materials as hereinabove discussed. It is generally considered desirable for purposes of the present invention that the metal with which boron is alloyed have a segregation coefficient with respect thereto in the range of .01 to 1. The segregation coefficient is defined as being the concentration of the material concerned in the solid solution ($C_s$) divided by the concentration of the material in the liquid solution ($C_l$). For purposes of description of the method of the present invention, silicon will be chosen as the material with which boron is alloyed and is not considered a limitation upon the scope of this invention. An ingot of the boron-silicon alloy may be prepared, for example, by mixing approximately 50 percent boron and approximately 50 percent silicon and placing the same in a crucible. The mixture is subjected to a temperature in the order of 1500° C. and is thereafter allowed to cool. The alloy may, of course, be prepared with any of the well known techniques for so doing, for example, by zone melting. After the alloy has been prepared, a thin slice or wafer is taken from it. An opening 13 is then produced in the wafer as by sandblasting. It is to be understood, however, that the opening 13 may be made by drilling, etching, or any other method known to the art. The size of opening 13 may vary according to design considerations for any particular application but a circular opening having a diameter on the order of 140 mils has proven quite successful. It is to be expressly understood, however, that the opening may take any configuration desired.

Although the following step is not considered essential for producing low resistivity regions in accordance with the present invention, it has been found advantageous in some applications. At least one surface of the alloy wafer is treated to provide a flat surface as by polishing, lapping, or etching in accordance with well known techniques. At least one surface of the semiconductor body is also prepared to exhibit the same type of finish. During subsequent steps of the method of the present invention as more fully explained hereinafter, these two surfaces are placed together. By so doing, it has been found that the alloy wafer is easily removed after junction formation and negligible damage results thereto so that the alloy wafer may be reused.

Figure 2:
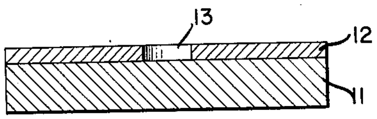

The alloy wafer is then placed upon the surface of semiconductor body 11 as shown at 12 in Fig. 2. An alloy wafer on the order of 5–10 mils thick has been found to produce excellent results.

Figure 3:
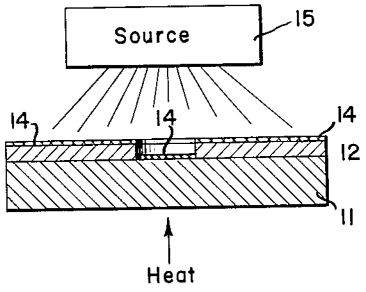

After the silicon-boron alloy is placed upon semiconductor body 11, the body is placed within an evaporation chamber; a chamber of the type shown in Patent No. 2,789,068 may be utilized for this purpose. The semiconductor body, along with the silicon-boron alloy wafer, is heated to a temperature above the eutectic temperature of silicon, boron and a solvent metal which is to be evaporated thereon as more fully explained hereinafter. After the predetermined temperature is reached, a solvent metal is evaporated from a source shown schematically at 15 upon at least a portion of the surface of the silicon-boron alloy wafer to form a layer as shown in Fig. 3 at 14. It should be noted that the evaporated solvent metal may enter opening 13 and contact body 11. Examples of solvent metals which may be utilized for purposes of the present invention are gold, silver, tin, aluminum and platinum. For purposes of the present invention, it will be assumed that the solvent metal utilized is aluminum. The semiconductor body and the silicon-boron alloy would, when aluminum is used as a solvent metal, be heated to a temperature between about 650° C. and 850° C., and it has been found that a temperature of about 800° C. works exceedingly well.

Figure 4:
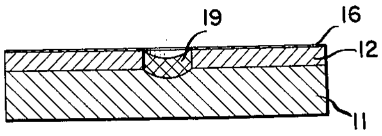
Figure 5:
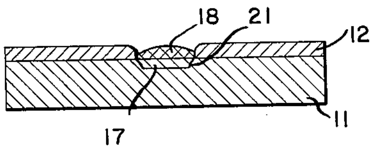

The molten aluminum which is evaporated upon the semiconductor body and silicon-boron alloy wafer dissolves at least a portion of the silicon-boron alloy wafer and a portion of the surface of semiconductor body 11 defined by opening 13 in wafer 12, thus forming a molten solution of ternary eutectic material as shown at 16 in Fig. 4. As the molten solvent metal dissolves the surface of wafer 12, surface tension causes the molten portion to flow into opening 13 and partially fill it as shown at 19 in Fig. 4. Since boron has a high solubility in silicon (that is a segregation constant approximately equal to 1) and since silicon has a high solubility in aluminum, and since the melting point of the ternary eutectic is much less than the melting point of boron and silicon, a large number of boron atoms are carried into the molten solution 19.

After the formation of the molten solution, heat is removed from the combination and it is allowed to cool at a predetermined rate. The rate of cooling is not critical and it has been found that by merely removing the source of heat and allowing the combination to cool within the evaporation chamber at a rate of approximately 30° C. per minute, satisfactory results have been obtained. Upon cooling a low resistivity region, as shown at 17 in Fig. 5, of silicon, containing atoms of aluminum and boron as active impurity doping agents, is first precipitated from the molten solution. These atoms of material will grow upon and follow the crystallographic plane of parent crystal 11. Upon further cooling, a ternary alloy 18 will freeze out and will be attached electrically and physically to low resistivity region 17. The alloy wafer 12 may, at this point, be removed by merely flicking it from the body 11 with a pair of tweezers or the like. Bonding between wafer 12 and alloy 18 has been experienced but to such a slight extent that very little damage is imparted to wafer 12 upon removal. After removal of alloy wafer 12 the device appears as shown in Fig. 6.

Leads may be attached to the alloy region 18 and to the parent crystal 11 at this stage by means well known to the art in order to form a silicon diode, assuming of course that crystal 11 is of N conductivity type; region 17 being P conductivity type and separated from body 11 by a P–N junction 21 since both boron and aluminum are active impurities capable of converting a semiconductor crystal to P conductivity type. It should be understood that the method of the present invention may also be utilized to form ohmic connections to semiconductor crystal bodies.

While the above description has been concerned with the evaporation of aluminum as the solvent metal, it should again be pointed out that such metals as gold, silver, platinum and tin may also be used in lieu of aluminum. It is noteworthy that by use of the method of this invention, P–N junctions may be formed by evaporating metals that are not active impurities. When metals such as gold, silver, platinum and tin are used as the solvent metal, a layer of material is provided on the semiconductor body to which lead attachment may be accomplished directly.

Although lead attachment to the layer 18 has been specified above, it should be understood that layer 18 may be removed and attachment made directly to converted region 17 if desired.

If it becomes desirable to produce a junction transistor as shown in Fig. 7, a converted region 33 may be formed in the opposite surface of semiconductor body 11 by carrying out the same steps as hereinabove described or by producing the junction in a manner such as that described in Patent No. 2,789,068, or otherwise, and thereafter connecting leads to the various portions of the semiconductor body in order to provide emitter, collector and base electrodes thereto.

As shown in Fig. 7, the low resistivity region 17 would serve as a high injection efficiency emitter within the transistor. The collector P-N junction region 33 has a metallic alloy button 35 affixed thereto. Leads would be attached to buttons 18 and 35 and to semiconductor body 11 to provide emitter, collector and base electrodes, respectively.

By carrying out the method of the present invention as hereinabove described, regrown regions having a resistivity of the order of .002 ohm centimeters have been constructed. Regrown regions of this resistivity contain approximately $10^{20}$ atoms of active impurity per cubic centimeter which is much greater than has heretofore been possible.

There has thus been disclosed a method for producing very low resistivity regions within a semiconductor body which may be utilized as a high current diode or high injection efficiency emitter within a transistor. There has also been disclosed devices constructed in accordance with this method.

What is claimed is:

1. The method of producing a low resistivity region within a semiconductor body comprising the steps of: preparing an alloy of boron and at least one metal having a relatively high numerical segregation coefficient with boron, forming at least a portion of said alloy to define a wafer having an opening therethrough, placing said wafer of said alloy upon one surface of said semiconductor body, heating the combination to at least the eutectic temperature of a composition composed of the semiconductor body and said alloy, evaporating a metal in which said alloy and said body are solvent upon at least a portion of said alloy, said temperature being sufficiently high that a portion of said alloy and said body are dissolved by said solvent metal, and cooling the combination to form said low resistivity region.

2. The method of producing a low resistivity P-type region within a semiconductor body comprising the steps of: preparing an alloy of boron and at least one metal having a segregation coefficient with boron between .01 and 1, slicing a wafer from said alloy, forming an opening through said wafer, placing said alloy wafer upon one surface of said semiconductor body, heating the combination to at least the eutectic temperature of a composition composed of the semiconductor body and said alloy, evaporating a metal, with which said alloy and said body are solvent upon at least a portion of said alloy, whereby a portion of said alloy and said body are dissolved by said solvent metal, and cooling the combination to form said low resistivity region.

3. The method of producing a low resistivity P-type region within a semiconductor body comprising the steps of: preparing an alloy of boron and at least one metal having a relatively high numerical segregation coefficient with boron, slicing a relatively thin layer having a thickness on the order of 10 mils, forming an opening through said wafer, placing said wafer upon one surface of said semiconductor body, heating the combination to at least the eutectic temperature of a composition composed of the semiconductor body and said alloy, evaporating a metal, with which said alloy and said body form a liquid solution at said temperature, upon substantially the entire surface of said alloy, whereby a portion of said alloy and said body are dissolved by said solvent metal, maintaining said temperature until a molten solution is produced which is at substantially thermodynamic equilibrium, and cooling the combination to form said low resistivity P-type region within said semiconductor body.

4. The method of producing a low resistivity P-type region within a silicon semiconductor body comprising the steps of: preparing an alloy of boron and silicon, forming at least a portion of said alloy into a wafer defining an opening therethrough, placing said silicon-boron alloy upon one surface of said semiconductor body, heating the combination to a predetermined temperature, evaporating a metal in which silicon and boron are solvent upon at least a portion of said alloy, said predetermined temperature being above the eutectic temperature of boron, silicon, and said solvent metal whereby a portion of said alloy and said body are dissolved, and cooling the combination with the initially molten eutectic composition in contact with the semiconductor body and at a predetermined rate to form said low resistivity P-type region within said semiconductor body.

5. The method of producing a low resistivity P-type region within an N-type silicon semiconductor body comprising the steps of: preparing an alloy of boron and silicon, slicing a wafer from said alloy, forming an opening through said wafer, placing said silicon-boron alloy upon one surface of said semiconductor body, heating the combination to a predetermined temperature, evaporating aluminum upon at least a portion of said silicon-boron alloy, maintaining said temperature above the eutectic temperature of silicon-boron-aluminum, whereby at least a portion of said silicon-boron alloy and said silicon semiconductor body are dissolved, and cooling the combination with the initially molten eutectic composition in contact with the semiconductor body and to form said low resistivity region.

6. The method of producing a low resistivity P-type regrown region with an N-type silicon semiconductor body comprising the steps of: preparing an alloy of boron and silicon containing between 5 percent and 50 percent boron, the remainder being silicon; slicing a wafer from said alloy, forming an opening through said wafer, providing a substantially flat surface on said body and said wafer, placing said wafer upon said body so that said flat surfaces are in contact, heating said semiconductor body and said alloy to a temperature between 650° C. and 850° C.; evaporating a layer of molten aluminum upon said alloy, whereby said molten aluminum dissolves at least a portion of said alloy and at least a portion of said surface of said semiconductor body to form a eutectic solution of aluminum-boron-silicon within said opening and contacting said body; cooling the combination to form an aluminum-boron doped P-type region edjacent said silicon body and separated therefrom by a P-N junction; and further cooling the combination to form an alloy button containing aluminum-boron-silicon electrically and mechanically affixed to said converted region.

7. The method of producing a semiconductor device having a low resistivity region, comprising the steps of: placing a perforated wafer of an alloy of boron and silicon upon a surface of a semiconductor body; heating the combination of said semiconductor body, an added solvent metal, and said alloy wafer to at least the eutectic temperature of a composition composed of the semiconductor body, the solvent metal, and the alloy of boron and silicon; applying said slvent metal in molten form over at least a portion of the surface area of said wafer including said perforation, whereby a portion of said semiconductor body and said alloy are dissolved by said solvent metal; and cooling said combination to form said low resistivity region.

8. The method of producing a semiconductor device having a low resistivity region, comprising the steps of: placing a wafer of an alloy of boron and silicon having an opening therethrough upon the surface of a semiconductor body; heating the combination of said semiconductor body, an added solvent metal, and said alloy wafer to at least the eutectic temperature of a composition composed of the semiconductor body, the solvent metal, and the alloy of boron and silicon; applying said solvent metal in molten form over at least a portion of the surface area of said wafer including said opening, whereby a portion of said semiconductor body and said alloy wafer are dissolved by said solvent metal; and cooling said combination to form said low resistivity region.

References Cited in the file of this patent

UNITED STATES PATENTS

| | | |
|---|---|---|
| 2,845,374 | Jones | July 29, 1958 |
| 2,854,366 | Wannlund et al. | Sept. 30, 1958 |